United States Patent
Wang et al.

(10) Patent No.: US 6,617,234 B2
(45) Date of Patent: Sep. 9, 2003

(54) METHOD OF FORMING METAL FUSE AND BONDING PAD

(75) Inventors: Sung-Hsiung Wang, Kaohsiung Hsien (TW); Yimin Huang, Taichung Hsien (TW); Chiung-Sheng Hsiung, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/835,014

(22) Filed: Apr. 13, 2001

(65) Prior Publication Data

US 2002/0155672 A1 Oct. 24, 2002

(30) Foreign Application Priority Data

Apr. 6, 2001 (TW) .......................... 90108258 A

(51) Int. Cl.⁷ .............................................. H01L 21/44
(52) U.S. Cl. ...................... 438/601; 438/601; 438/612; 438/754; 438/978; 438/713
(58) Field of Search ................... 438/15, 123, 403, 438/461, 735, 705, 706, 717, 733, 739, 585, 586, 587, 588, 595, 605, 612, 618, 622, 696, 601, 754, 978, 713, FOR 458, FOR 453; 257/529, 530, 666, 670, 672, 673, 676, 690, 735, 737, 751, 767; 216/14, 37, 59, 72

(56) References Cited

U.S. PATENT DOCUMENTS

| 5,053,849 A | * 10/1991 | Izawa et al. ................. 257/401 |
| 5,578,166 A | * 11/1996 | Hirota .......................... 216/67 |
| 5,607,877 A | * 3/1997 | Matsuda et al. ............ 438/613 |
| 5,798,819 A | * 8/1998 | Motsiff ....................... 438/618 |
| 5,858,869 A | * 1/1999 | Chen et al. ................. 438/597 |
| 6,358,831 B1 | * 3/2002 | Liu et al. .................... 438/612 |

* cited by examiner

*Primary Examiner*—George Fourson
*Assistant Examiner*—Julio J Maldonado
(74) *Attorney, Agent, or Firm*—J.C. Patents

(57) ABSTRACT

A method of forming metal fuses and bonding pads. A conductive layer is formed in a substrate. A dielectric layer is formed over the substrate. The dielectric layer has an opening that exposes a portion of the conductive layer. A metallic layer is formed over the dielectric layer. The metallic layer is patterned to form a metal fuse and a bonding pad. The bonding pad is electrically connected to the conductive layer via the opening. Both the metal fuse and the bonding pad have undercut sidewalls. Spacers are formed on the undercut sidewalls of the metal fuse and the bonding pad. Finally, a passivation layer that exposes the metal fuse and the bonding pad is formed over the substrate.

18 Claims, 2 Drawing Sheets

METHOD OF FORMING METAL FUSE AND BONDING PAD

CROSS-REFERENCE TO RELATED APPLICATION

This application claims the priority benefit of Taiwan application serial no. 90108258, filed on Apr. 6, 2001.

BACKGROUND OF THE INVENTION

1. Field of Invention

The present invention relates to a method of manufacturing semiconductor. More particularly, the present invention relates to a method of forming metal fuse and bonding pad.

2. Description of Related Art

In the manufacturing of semiconductor memory, some or even one defective memory cell in an integrated circuit will render the entire chip defective. In general, a densely packed integrated circuit will produce more device defects than a loosely packed integrated circuit. Hence, as the level of integration increases, yield of the semiconductor product may drop correspondingly.

To increase the yield of semiconductor production, redundancy circuits are often added to the integrated circuit. The redundancy circuits, besides serving as a memory array for holding binary data, also provide redundant memory cell for substituting defective memory cells. The redundant memory cells are connected to word lines and bit lines respectively. If several thousand memory cells in the main memory cell array are found to be defective after circuit testing, all the defective memory cells can be replaced by the redundant memory cells so that a faultless memory chip is produced.

A memory circuit, besides having a normal memory cell array, further includes a standby memory cell array (or redundant memory cell array) for substituting defective memory cells when required. In general, main memory cell array and the redundant memory cell array are interconnected through fuses. When a defective memory cell needs to be replaced, the particular fuse leading to the defective cell is cut. To reduce cost and complexity in application as the level of integration increases, metal fuses are formed on the uppermost layer of the semiconductor device. In other words, the metal fuses and the bonding pad are often formed on the same layer.

Conventionally, the metal fuses and the bonding pads are formed on the same layer by forming a metallic layer over a substrate and then patterning the metallic layer so that the metal fuses and the bonding pads are formed concurrently. However, in general, a thick bonding pad and a thin metal fuse are preferred. Consequently, conflicting considerations have to be resolved if metal fuses and bonding pads are required to form on the same metallic layer. For example, a relatively thin metallic layer must be formed if easily cut metal fuses are required after patterning. On the other hand, thickness of the bonding pads is restricted by subsequent wire bonding because insufficient bonding pad thickness often leads to pad-joining problems.

SUMMARY OF THE INVENTION

Accordingly, one object of the present invention is to provide a method of forming metal fuse and bonding pad with due considerations to bonding pad requirements.

To achieve these and other advantages and in accordance with the purpose of the invention, as embodied and broadly described herein, the invention provides a method of forming metal fuse and bonding pad. A conductive layer is formed in a substrate. A dielectric layer is formed over the substrate. The dielectric layer has an opening that exposes a portion of the conductive layer. A metallic layer is formed over the dielectric layer. The metallic layer is patterned to form a metal fuse and a bonding pad. The bonding pad is electrically connected to the conductive layer via the opening. Both the metal fuse and the bonding pad have undercut sidewalls. Spacers are formed on the undercut sidewalls of the metal fuse and the bonding pad. Finally, a passivation layer that exposes the metal fuse and the bonding pad is formed over the substrate.

In this invention, metal fuses and bonding pads are formed on the same layer so that production cost and manufacturing complexity are reduced. In addition, thicker bonding pads are produced thereby increasing the bondability of wire in subsequent wire-bonding step. Furthermore, the metal fuses have undercut sidewalls. Hence, width of each metal fuse is narrower and burning is quicker. The presence of spacers over the undercut sidewalls also prevents horizontal sputtering of metal while the metal fuse is burnt. Thus, bridging between metal fuses is avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
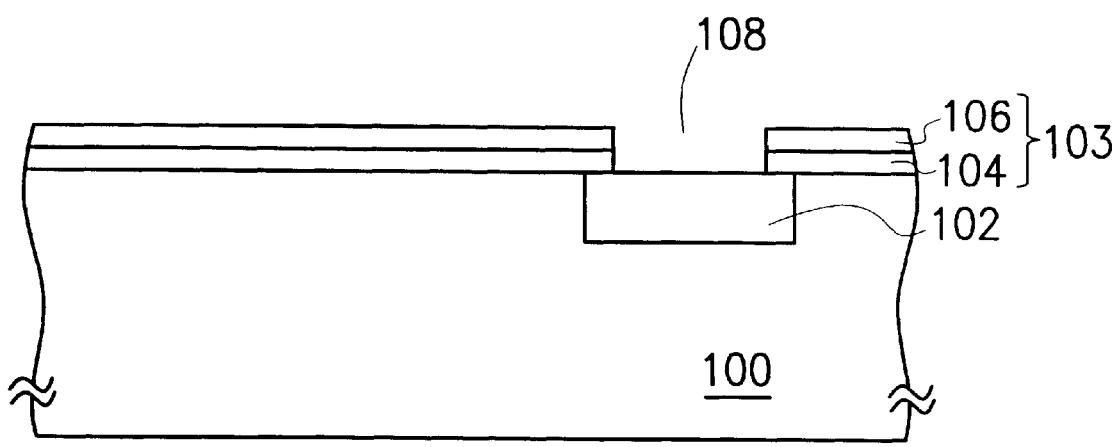
FIGS. 1 through 4 are schematic cross-sectional views showing the progression of steps for forming metal fuses and bonding pads according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 through 4 are schematic cross-sectional views showing the progression of steps for forming metal fuses and bonding pads according to one preferred embodiment of this invention.

As shown in FIG. 1, a substrate 100 having a semiconductor device therein is provided. A conductive layer 102 is formed in the substrate 100. The conductive layer 102 can be a copper layer, for example. A dielectric layer 103 is formed over the substrate 100. To prevent the diffusion of metal from the conductive layer 102, the dielectric layer 103 is preferably formed by sequentially forming a silicon nitride layer 104 and a silicon oxide layer 106 over the substrate 100. The silicon nitride layer 104 has a thickness of between 300 Å to 1000 Å and the silicon oxide layer has a thickness of between 8000 Å to 1000 Å. An opening 108 that exposes a portion of the conductive layer 102 is formed in the dielectric layer 103.

Figure 2:
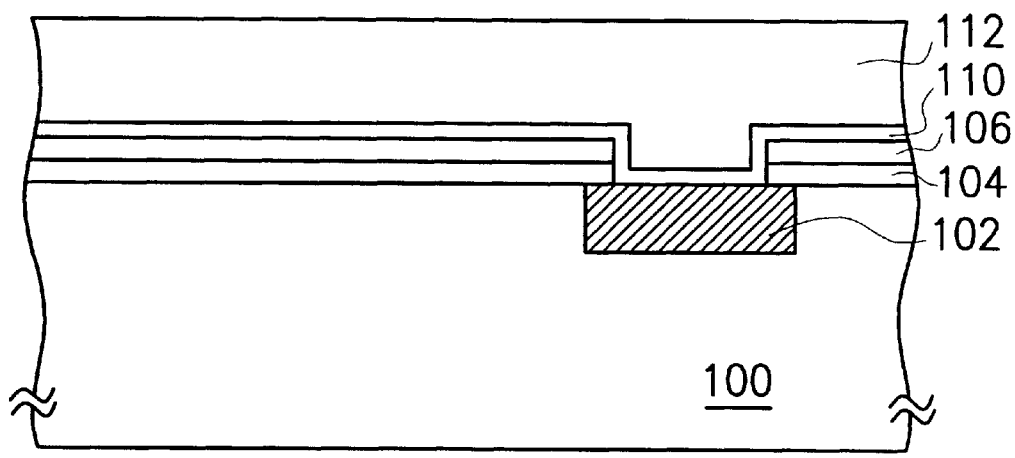

As shown in FIG. 2, a barrier layer 110 is formed over the dielectric layer 103 and the exposed surface of the opening 108. The barrier layer 110 can be a composite layer, for example, a tantalum nitride (TaN) layer having a thickness between 100 Å to 300 Å and a tantalum (Ta) layer having a thickness also between 100 Å to 300 Å. Alternatively, the barrier layer 110 can be a titanium nitride (TiN) layer having a thickness between 100 Å to 300 Å. A metallic layer 112 is formed over the barrier layer 110. The metallic layer 112 is preferably an aluminum layer.

Figure 3:
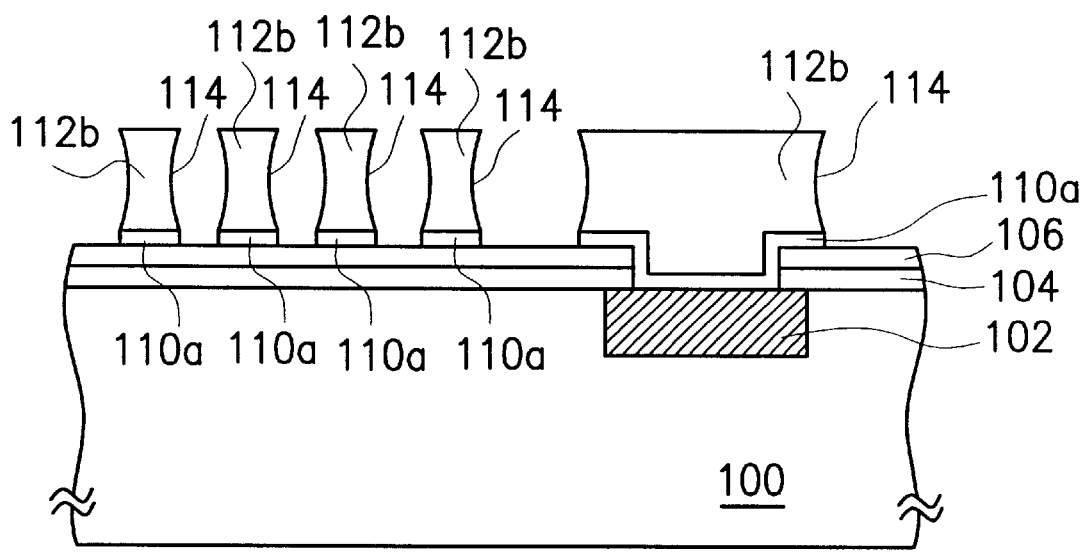

As shown in FIG. 3, isotropic etching is carried out to pattern the metallic layer 112, thereby forming a bonding pad 112a and a plurality of metal fuses 112b at the same time. The isotropic etching also undercuts the sidewalls of the bonding pad 112a and metal fuses 112b and produces undercut sidewalls 114. The method of producing the undercut sidewalls 114 includes adjusting the flow rate ratio of the gaseous etchants in the isotropic etching step. An alternative way of adjusting the undercut 114 is to vary the ingredients of the gaseous etchants in the isotropic etching operation. Hence, high molecular weight compound is precisely deposited on the sidewalls of the bonding pad 112a and the fuses 112b to form the undercut sidewalls 114.

Figure 4:
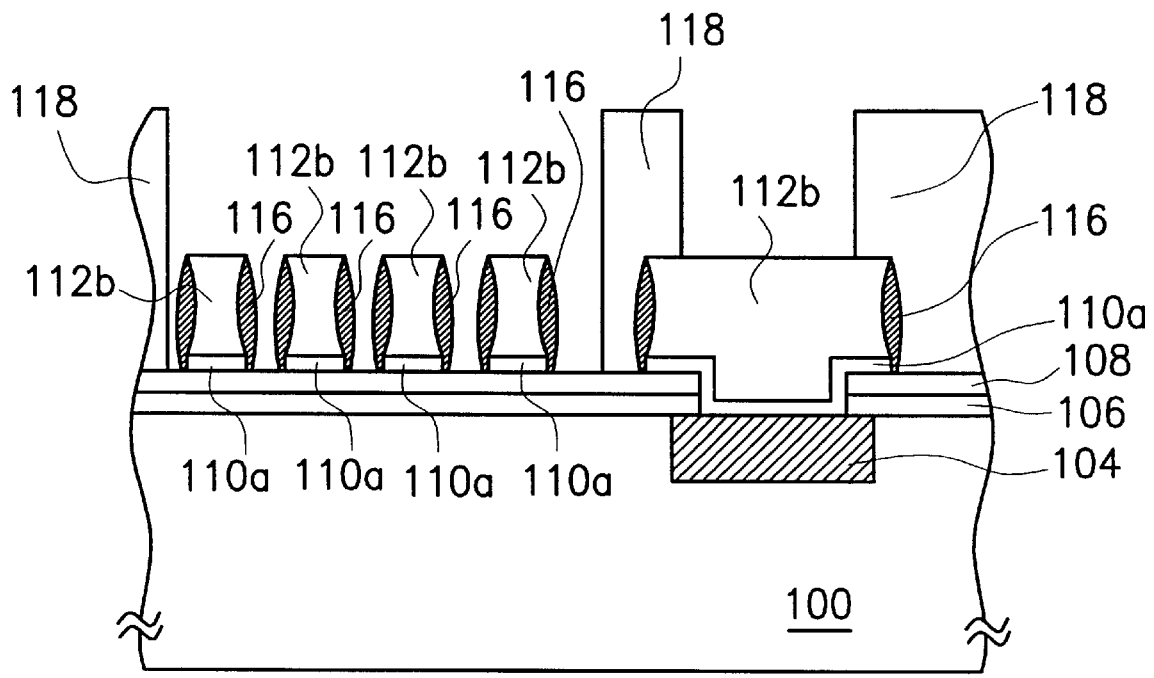

As shown in FIG. 4, an insulation layer (not shown) is formed over the substrate 100. An anisotropic etching of the insulation layer is carried out to form spacers 116 on the undercut sidewalls 114 of the bonding pad 112a and the fuses 112b. In this invention, since isotropic etching method is used to form the undercuts 114 on the sidewalls of the fuses 112b, each metal fuse 112b has a narrow width for easy burning. In addition, a metallic layer 112 having a greater thickness can be formed to increase overall thickness of the bonding pad 112a so that bondability in subsequent wire-bonding operation is ensured. Furthermore, since each spacer 116 is formed on an undercut sidewall surface, the spacer 116 has a greater thickness than a spacer formed on a vertical sidewall. Consequently, horizontal sputtering of the fuse material during burning is minimized and bridging of neighboring fuses 112b is avoided.

In the subsequent step, a passivation layer 118 is formed over the substrate 100 exposing just the bonding pad 112a and the metal fuses 112b. The passivation layer 118 is formed by first depositing an oxide layer having a thickness of between 4000 Å to 7000 Å, and then depositing a nitride layer having a thickness also between 4000 Å to 7000 Å over the oxide layer. Thereafter, the oxide layer and the nitride layer are patterned to expose the bonding pad 112a and the metal fuses 112b.

By forming the metal fuses and the bonding pads on the same material layer in this invention, production cost and manufacturing complexity is reduced. In addition, a thicker bonding pad can be manufactured so that bondability of wire-bonding operation is improved. Moreover, each metal fuse has undercut sidewalls contributing to a narrower width. Hence, the fuses are easier to burn. Furthermore, the presence of sidewall spacers on each side of the fuse prevents the horizontal sputtering of fuse material during burning and avoids unnecessary bridging between neighboring fuses.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming metal fuses and bonding pads, comprising the steps of:

forming a conductive layer in a substrate;

forming a dielectric layer over the substrate, wherein the dielectric layer has an opening that exposes a portion of the conductive layer;

forming a metallic layer over the dielectric layer;

performing an isotropic etching operation to pattern the metallic layer, whereby forming a metal fuse and a bonding pad such that the bonding pad is electrically connected to the conductive layer via the opening, and that a plurality of undercut sidewalls is formed on each side of the metal fuse and the bonding pad;

forming a plurality of insulation spacers on the undercut sidewalls of the metal fuse and the bonding pad; and forming a passivation layer that exposes the metal fuse and the bonding pad over the substrate.

2. The method of claim 1, wherein the step of forming the conductive layer includes depositing copper to form a copper layer.

3. The method of claim 1, wherein the step of forming the dielectric layer includes depositing silicon nitride and silicon oxide in sequence to form a composite layer.

4. The method of claim 3, wherein the silicon nitride layer has a thickness between about 300 Å to 1000 Å.

5. The method of claim 3, wherein the silicon oxide layer has a thickness between about 8000 Å to 10000 Å.

6. The method of claim 1, wherein the step of forming the metallic layer includes depositing aluminum.

7. The method of claim 1, wherein the step of forming the passivation layer includes depositing silicon oxide and silicon nitride in sequence to form a composite layer.

8. The method of claim 7, wherein the silicon oxide layer has a thickness between about 4000 Å to 7000 Å.

9. The method of claim 7, wherein the silicon nitride layer has a thickness between about 4000 Å to 7000 Å.

10. A method of forming metal fuses and bonding pads, comprising the steps of:

forming a dielectric layer over a substrate, wherein the dielectric layer has an opening;

forming a metal fuse and a bonding pad over the dielectric layer and at the same time;

forming an undercut sidewall on each side of the metal fuse and the bonding pad with an isotropic etching operation;

forming an insulation spacer on each undercut sidewall of the metal fuse and the bonding pad; and forming a passivation layer that exposes the metal fuse and the bonding pad over the substrate.

11. The method of claim 10, wherein the step of forming the dielectric layer includes depositing silicon nitride and silicon oxide in sequence to form a composite layer.

12. The method of claim 11, wherein the silicon nitride layer has a thickness between about 300 Å to 1000 Å.

13. The method of claim 11, wherein the silicon oxide layer has a thickness between about 8000 Å to 10000 Å.

14. The method of claim 10, wherein material constituting the metal fuse includes aluminum.

15. The method of claim 10, wherein material constituting the bonding pad includes aluminum.

16. The method of claim 10, wherein the step of forming the passivation layer includes depositing silicon oxide and silicon nitride in sequence to form a composite layer.

17. The method of claim 16, wherein the silicon oxide layer has a thickness between about 4000 Å to 7000 Å.

18. The method of claim 16, wherein the silicon nitride layer has a thickness between about 4000 Å to 7000 Å.

* * * * *